(12) United States Patent
Pindl et al.

(10) Patent No.: US 11,402,556 B2
(45) Date of Patent: Aug. 2, 2022

(54) WAFER LEVEL METHOD FOR MANUFACTURING INTEGRATED INFRARED (IR) EMITTER ELEMENTS HAVING AN OPTICAL IR FILTER PLACED ON THE MAIN SURFACE REGION OF THE CARRIER SUBSTRATE ON WHICH THE IR EMITTER IS FORMED

(71) Applicant: Infineon Technologies AG, Neubiberg (DE)

(72) Inventors: Stephan Pindl, Ergoldsbach (DE); Matthias Steiert, Ehrenkirchen (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 249 days.

(21) Appl. No.: 16/779,928

(22) Filed: Feb. 3, 2020

(65) Prior Publication Data
US 2020/0249380 A1    Aug. 6, 2020

(30) Foreign Application Priority Data
Feb. 6, 2019 (EP) ..................................... 19155782

(51) Int. Cl.
G02B 5/20 (2006.01)
B81C 1/00 (2006.01)
H05B 3/00 (2006.01)

(52) U.S. Cl.
CPC .......... *G02B 5/208* (2013.01); *B81C 1/00539* (2013.01); *H05B 3/009* (2013.01)

(58) Field of Classification Search
CPC ................ G02B 5/208; B81C 1/00539; B81C 2203/0118; B81C 1/00317; H05B 3/009; B81B 2203/0109; G01N 21/1702
See application file for complete search history.

(56) References Cited

U.S. PATENT DOCUMENTS

2018/0146512 A1 * 5/2018 Pindl .................. G02B 5/26
2018/0273373 A1 * 9/2018 Pindl .................. G01N 29/2418

* cited by examiner

*Primary Examiner* — Ermias T Woldegeorgis
(74) *Attorney, Agent, or Firm* — Slater Matsil, LLP

(57) ABSTRACT

A method for manufacturing integrated IR (IR=infrared) emitter elements having an optical filter comprises back side etching through a carrier substrate, forming adhesive spacer elements on a conductive layer on the carrier substrate, placing a filter substrate having a filter carrier substrate and a filter layer on the adhesive spacer elements, fixing the adhesive spacer elements to the carrier substrate and the filter substrate by curing, pre-dicing through the filter substrate for exposing the contact pads of the structured conductive layer, and dicing through the frame structure in the carrier substrate for separating the integrated IR emitter elements having the optical filter.

14 Claims, 4 Drawing Sheets

```
┌─────────────────────────────────────────────────────────────┐
│  Providing a carrier substrate having a target thickness,   │
│  wherein an insulating material layer and a structured      │
│  conductive layer are arranged on a first main surface      │──110
│  region of the carrier substrate, wherein the insulating    │
│  material layer is arranged between the carrier substrate   │
│  and the structured conductive layer                        │
└─────────────────────────────────────────────────────────────┘

┌─────────────────────────────────────────────────────────────┐
│  Back side etching through the carrier substrate for        │
│  providing cavities extending between the first and second  │
│  main surface regions of the carrier substrate, wherein the │
│  cavities form a frame structure which laterally surrounds  │
│  the cavities, wherein first portions of the structured     │──120
│  conductive layer which span the cavities form active       │
│  heating regions of the IR emitter elements, and wherein    │
│  second and third portions of the structured conductive     │
│  layer which are supported by the frame structure form      │
│  first and second contact pads of the IR emitter elements   │
└─────────────────────────────────────────────────────────────┘

┌─────────────────────────────────────────────────────────────┐
│  Forming adhesive spacer elements on portions of the        │──130
│  structured conductive layer, which are supported by the    │
│  frame structure                                            │
└─────────────────────────────────────────────────────────────┘

┌─────────────────────────────────────────────────────────────┐
│  Placing a filter substrate having a filter carrier         │
│  substrate and a filter layer on the adhesive spacer        │──140
│  elements, so that the filter layer is arranged between     │
│  the adhesive spacer elements and the filter carrier        │
│  substrate                                                  │
└─────────────────────────────────────────────────────────────┘

┌─────────────────────────────────────────────────────────────┐
│  Fixing the adhesive spacer elements to the carrier         │──150
│  substrate and the filter carrier substrate by curing the   │
│  material of the adhesive spacer elements                   │
└─────────────────────────────────────────────────────────────┘

┌─────────────────────────────────────────────────────────────┐
│  Pre-dicing through the filter substrate for exposing the   │──160
│  contact pads of the structured conductive layer            │
└─────────────────────────────────────────────────────────────┘

┌─────────────────────────────────────────────────────────────┐
│  Dicing through the frame structure in the carrier          │──170
│  substrate for separating the integrated IR emitter         │
│  elements having an optical filter                          │
└─────────────────────────────────────────────────────────────┘
```

FIG 1

(optional)

WAFER LEVEL METHOD FOR MANUFACTURING INTEGRATED INFRARED (IR) EMITTER ELEMENTS HAVING AN OPTICAL IR FILTER PLACED ON THE MAIN SURFACE REGION OF THE CARRIER SUBSTRATE ON WHICH THE IR EMITTER IS FORMED

This application claims the benefit of European Application No. 19155782, filed on Feb. 6, 2019, which application is hereby incorporated herein by reference.

TECHNICAL FIELD

Embodiments relate in general to the field of MEMS devices (MEMS=microelectromechanical system) and, more specifically, to a method for manufacturing integrated IR (IR=infrared) emitter elements having an optical filter. Thus, embodiments relate to a method of manufacturing integrated IR emitter elements having an optical filter on a wafer level and, further, to the resulting structure of the integrated IR emitter elements having the optical filter.

BACKGROUND

The detection of environmental parameters in the ambient atmosphere is becoming increasingly important in the implementation of appropriate sensors within mobile devices, but also at the application in home automation, such as smart home, and, for example in the automotive sector. However, with the evermore extensive use of sensors, there is also a particular need to be able to produce such sensors as inexpensively as possible and thus, cost-effectively, but nevertheless the resulting reliability and accuracy of the sensors should be maintained or even increased.

For integrated circuits, like MEMS devices, where resulting size (footprint) and height of the resulting chip is of high importance, especially if the chip should be implemented in mobile devices, like a smartphone. Additionally, the resulting costs for the "sensor chip" are very important for MEMS solutions.

However, existing solutions cannot provide an IR emitter and an IR filter which can be implemented in a single small size package with additional other integrated circuits (chips) especially in mobile devices, such as smartphone, as the resulting combination of IR emitter and IR filter does not comprise a sufficiently low size (footprint) and height and cannot be manufactured inexpensively. Thus, existing solutions for a combined IR emitter and IR filter are especially too large in height and size and too expensive to manufacture and, therefore, not suitable for applications in mobile devices.

In existing solutions, an IR emitter and an IR filter are separate devices and have to be placed separately in a common package. In specific solutions, the IR filter is directly placed on the emitter. This is typically conducted by an expensive chip-on-chip-manufacturing process.

Generally, there is a need in the art for an approach to implement an IR emitter element having an optical filter offering a combination of (1) a small footprint and (2) a relatively narrow emission spectrum, wherein a relatively uncomplicated design of the IR emitter element results in an inexpensive fabrication process.

To be more specific, there is a need in the art to minimize the complete IR emitter/filter system and to minimize at the same time the costs.

Such a need can be solved by the method for manufacturing integrated IR emitter elements having an optical filter according to claim 1. In addition, specific implementations of the different embodiments are defined in the dependent claims.

SUMMARY

According to an embodiment, a method 100 for manufacturing, e.g., on wafer level, the integrated IR (IR=infrared) emitter elements 200 having the optical filter comprises the step 110 of providing a carrier substrate having a target thickness, wherein an insulating material layer and a structured conductive layer are arranged on a first main surface region of the carrier substrate. The insulating material layer is arranged, e.g., vertically, between the carrier substrate and the structured conductive layer.

In step 120, the method comprises back side etching through the carrier substrate for providing cavities extending between the first and second main surface regions of the carrier substrate, wherein the cavities form a frame structure which laterally surrounds the cavities. The first portions of the structured conductive layer which span the cavities form active heating regions of the IR emitter elements, wherein second and third portions of the structured conductive layer which are supported by the frame structure form first and second contact pads of the IR emitter elements.

In step 130, the method comprises forming adhesive spacer elements or stand-offs on portions of the structured conductive layer, which are supported by the frame structure.

In step 140, the method comprises placing a filter substrate having a filter carrier substrate and a filter layer on the adhesive spacer elements, so that the filter layer is arranged between the adhesive spacer elements and the filter carrier substrate.

In step 150, the method comprises fixing the adhesive spacer elements to the carrier substrate and the filter substrate by curing, e.g., hardening or hard baking, the material, e.g., a polymer or epoxy material, of the adhesive spacer elements.

In step 160, the method comprises pre-dicing through the filter substrate for exposing the contact pads of the structured conductive layer.

In step 170, the method comprises dicing through the frame structure in the carrier substrate for separating the integrated IR emitter elements having an optical filter.

According to an embodiment, the method 100 may comprises an optional step 180 of thinning the carrier substrate from the second main surface region for providing the carrier substrate having the target thickness.

BRIEF DESCRIPTION OF THE DRAWINGS

Embodiments of the present method for manufacturing integrated IR emitter elements having an optical filter are described herein making reference to the appended drawings and figures.

FIG. 1 shows an exemplary process flow (flowchart) of the method for manufacturing the integrated IR emitter elements having an optical filter according to an embodiment;

Figure 2A:
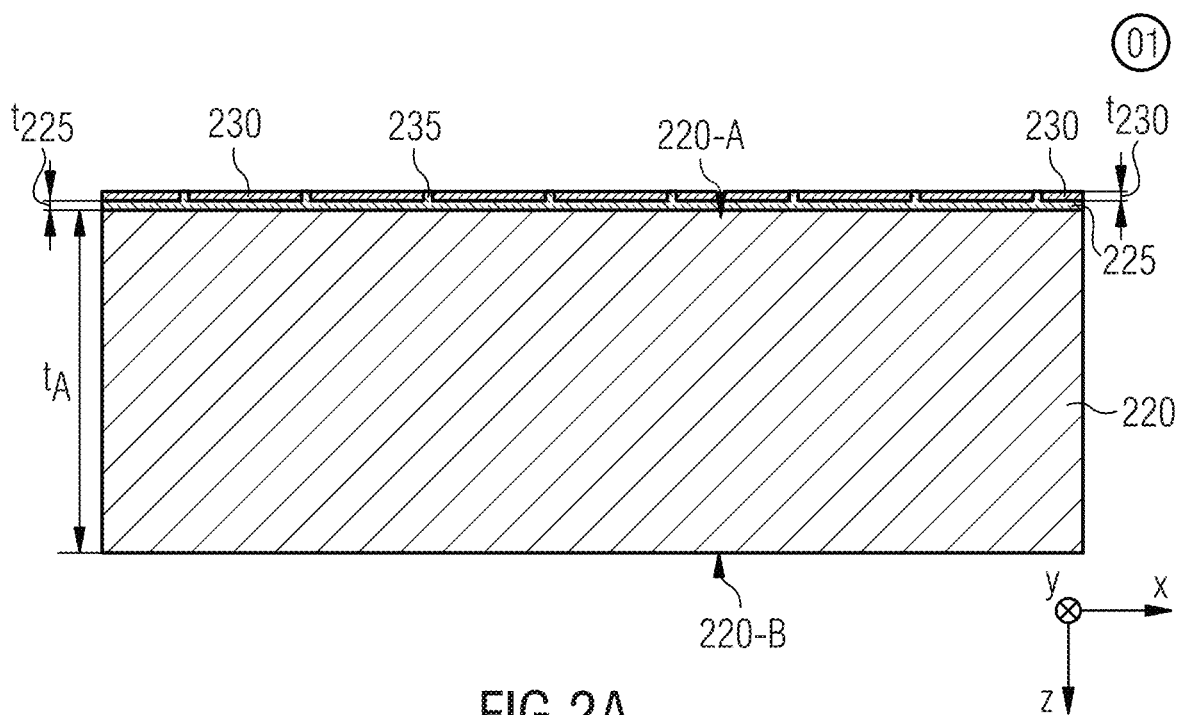
FIGS. 2A-2G show schematic cross sectional views (schematic snapshots) in the x-z-plane at different exemplary process stages of the method for manufacturing integrated IR emitter elements having an optical filter on waver level according to an embodiment.

Before discussing the present embodiments in further detail using the drawings, it is pointed out that in the figures and the specification identical elements and elements having the same functionality and/or the same technical or physical effect are usually provided with the same reference numbers or are identified with the same name, so that the description of these elements and of the functionality thereof as illustrated in the different embodiments are mutually exchangeable or may be applied to one another in the different embodiments.

DETAILED DESCRIPTION OF ILLUSTRATIVE EMBODIMENTS

In the following description, embodiments are discussed in detail, however, it should be appreciated that the embodiments provide many applicable concepts that can be embodied in a wide variety of semiconductor devices. The specific embodiments discussed are merely illustrative of specific ways to make and use the present concept, and do not limit the scope of the embodiments. In the following description of embodiments, the same or similar elements having the same function have associated therewith the same reference signs or the same name, and a description of these elements will not be repeated for every embodiment. Moreover, features of the different embodiments described hereinafter may be combined with each other, unless specifically noted otherwise.

It is understood that when an element is referred to as being "connected" or "coupled" to another element, it may be directly connected or coupled to the other element, or intermediate elements may be present. Conversely, when an element is referred to as being "directly" connected to another element, "connected" or "coupled," there are no intermediate elements. Other terms used to describe the relationship between elements should be construed in a similar fashion (e.g., "between" versus "directly between", "adjacent" versus "directly adjacent", and "on" versus "directly on", etc.).

For facilitating the description of the different embodiments, the FIGS. 2A-2G and 3 comprise a Cartesian coordinate system x, y, z, wherein the x-y-plane may correspond, i.e., is parallel, to the first main surface region of the substrate, and wherein the depth direction vertical to the first main surface region and into the substrate corresponds to the "z" direction, i.e., is parallel to the z direction. In the following description, the term "lateral" means a direction parallel to the x-direction, wherein the term "vertical" means a direction parallel to the z-direction.

FIG. 1 shows an exemplary process flow (flowchart) of the method 100 of manufacturing integrated IR emitter elements 200 having an optical IR filter according to an embodiment.

According to an embodiment, the method 100 for manufacturing, e.g., on wafer level, the integrated IR (IR=infrared) emitter elements 200 having the optical filter comprises the step 110 of providing a carrier substrate having a target thickness, wherein an insulating material layer and a structured conductive layer are arranged on a first main surface region of the carrier substrate. The insulating material layer is arranged, e.g., vertically, between the carrier substrate and the structured conductive layer.

In step 120, the method comprises back side etching through the carrier substrate for providing cavities extending between the first and second main surface regions of the carrier substrate, wherein the cavities form a frame structure which laterally surrounds the cavities. The first portions of the structured conductive layer which span the cavities form active heating regions of the IR emitter elements, wherein second and third portions of the structured conductive layer which are supported by the frame structure form first and second contact pads of the IR emitter elements.

In step 130, the method comprises forming adhesive spacer elements or stand-offs on portions of the structured conductive layer, which are supported by the frame structure.

In step 140, the method comprises placing a filter substrate having a filter carrier substrate and a filter layer on the adhesive spacer elements, so that the filter layer is arranged between the adhesive spacer elements and the filter carrier substrate.

In step 150, the method comprises fixing the adhesive spacer elements to the carrier substrate and the filter substrate by curing, e.g., hardening or hard baking, the material, e.g., a polymer or epoxy material, of the adhesive spacer elements.

In step 160, the method comprises pre-dicing through the filter substrate for exposing the contact pads of the structured conductive layer.

In step 170, the method comprises dicing through the frame structure in the carrier substrate for separating the integrated IR emitter elements having an optical filter.

According to an embodiment, the method 100 may comprises an optional step 180 of thinning the carrier substrate from the second main surface region for providing the carrier substrate having the target thickness.

According to a further embodiment, the carrier substrate may comprise a semiconductor material or a glass material, wherein the back side etching step 120 may comprise a Bosch-etching process in case the carrier substrate comprises a semiconductor material, or wherein the back side etching step 120 may comprise a wet etching step in case the carrier substrate comprises a glass material.

According to a further embodiment, the step of forming 130 the adhesive spacer elements may comprises the sub-step 132 of depositing an adhesive material layer on the exposed surface region of the structured conductive material layer, and the sub-step 134 of photo-lithographically structuring the deposited adhesive layer for providing the adhesive spacer elements.

According to a further embodiment, the adhesive material may comprise at least one of a polymer material, an epoxy resin material and a photoresist material.

According to a further embodiment, the step 132 of depositing may comprise spin-coating the adhesive material on the exposed surface region of the structured conductive material layer.

According to a further embodiment, the adhesive spacer elements are formed to laterally surround the active heating regions of the structured conductive layer.

According to a further embodiment, the adhesive spacer elements, which may laterally surround the active heating regions of the structured conductive layer, and the filter substrate provide further cavities on the active heating regions of the structured conductive layer.

According to a further embodiment, the structured conductive layer may comprise at least one opening, e.g., at least one ventilation hole to the cavity, in each of the portions of the structured conductive layer which span the cavities.

According to a further embodiment, the method may further comprise an optional step 190 of release etching the insulating material layer for removing the insulating material layer within the frame structure from the structured conductive layer.

According to a further embodiment, the release etching step 190 opens the at least one opening or ventilation hole in the structured conductive layer in the active heating area of the structured conductive layer 230.

According to a further embodiment, the pre-dicing step 160 through the filter substrate comprises a dicing through the filter carrier substrate and the filter layer.

According to a further embodiment, the material of the filter carrier substrate is transparent for the radiation emitted by the heater structure and transmitted through the filter layer.

In the following, a possible implementation of the method 100 for manufacturing integrated IR (IR=infrared) emitter elements 200 having an optical filter 210 is exemplarily described. Furthermore, optional process steps of the method 100 for manufacturing the integrated IR (IR=infrared) emitter elements 200 are exemplarily described.

FIGS. 2A-2G show schematic cross sectional views (schematic snapshots) in the x-z-plane at different exemplary process stages of the method 100 for manufacturing the integrated IR emitter elements 200 having an optical filter 210 on waver level according to an embodiment. Thus, FIGS. 2A-2G show an exemplary process flow or flowchart of the method 100 for manufacturing the integrated emitter elements 200 having the optical filter 210.

With respect to the method 100 as shown in FIG. 2, it is pointed out to the fact that this process flow is one example of multiple ways of how to fabricate the integrated IR emitter elements 210 having an optical filter 210 on wafer level, wherein the various processing steps can be executed in a different order or may be combined with additional fabrication steps and/or structuring techniques.

Step 01—FIG. 2A: As shown in step 01 of FIG. 2A, a carrier substrate 220 having a first thickness to is provided, wherein an insulating material layer 225 and a structured conductive layer 230 are arranged on a first main surface region 220-A of the carrier substrate 220. Thus, the insulating material 225 is vertically arranged between the carrier substrate 220 and the structured conductive layer 230.

The carrier substrate 220 may comprise a semiconductor material, e.g., silicon, or an insulating material, e.g., glass. Thus, a semiconductor wafer or glass wafer may form the carrier substrate 220.

Furthermore, the insulating material layer 225 may comprise an oxide or nitride material, e.g., silicon oxide or silicon nitride. The insulating material layer 225 may form in subsequent process steps an etch stop layer and/or a sacrificial layer (see, for example, steps 03 and 06 below). The insulating material layer 225 may comprise a thickness $t_{225}$ in the range between 4 µm and 50 µm, or between 10 µm and 30 µm, for example.

The conductive material layer 230, applied on the insulating material layer 225, may comprise a conductive material, e.g., a conductive semiconductor material, such as silicon or polysilicon, or may comprise a conductive metal material, such as platinum, silver, etc. The structured conductive layer 230 may comprise a thickness $t_{230}$ in the range between 1 µm and 100 µm, or between 10 µm and 60 µm, for example.

The structured conductive layer 230 may form an IR emitter element layer and may have been applied during an IR emitter manufacturing process (not shown in FIG. 2A) on the insulating material layer 225. During that IR emitter manufacturing process, ventilation holes 235 may be optionally formed in the conductive material layer 230 (=IR emitter element layer) which may be filled with an insulating material, e.g., the insulating material of the insulating material layer 225. Thus, the structured conductive layer 230 may comprise at least one opening 235 in each of the portions 230-1 of the structured conductive layer 230 which span the cavities 240.

Thus, step 1 of FIG. 2 shows a pre-process of providing a carrier substrate 220, e.g., in form of a silicon or glass substrate wafer, with the IR emitter layer 230. In case the first thickness $t_A$ of the carrier substrate 220 corresponds to the target thickness $t_B$, step 1 of FIG. 2 corresponds to step 110 of FIG. 1.

Currently, the thickness of typical carrier substrates 220 (such as for an 8-inch wafers), may be in a range between 500 to 1000 µm or may be about 725 µm (=IR Emitter Wafer Full Thickness), for example. In case the following process steps of the manufacturing method 100 may allow for a thinner thickness of the carrier substrate 220, an optional thinning step 160 (see, for example, step 02 below) may be conducted for thinning the carrier substrate 220 from the second main surface region 220-B for providing the carrier substrate 220 having the target thickness $t_B$. Moreover, the thinner the target thickness $t_B$ can be chosen the thinner (=smaller) are the resulting integrated IR emitter elements 210.

Figure 2B:
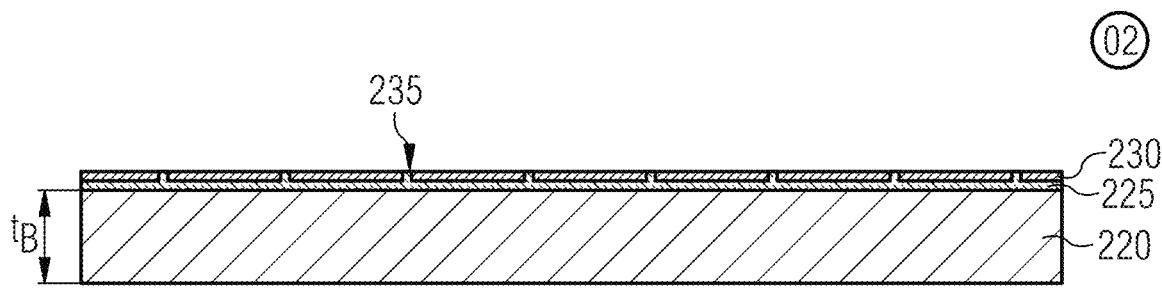

Step 02—FIG. 2B: (optional) Thus, the method 100 may further comprise the step of thinning 160 the carrier substrate 220 from the second main surface region 220-B for providing the carrier substrate 220 having the target thickness $t_B$.

The thinning step 160 may be conducted by means of a grinding step. Thus, wafer thinning of the carrier substrate 220 may be formed by means of a grinding step. The original substrate thickness $t_A$, which may be in the range of about 725 µm, may be thinned by grinding down to 200 µm or 250 µm (applies to an 8-inch wafer, for example).

The resulting target thickness $t_B$ may be selected such that the thinned carrier substrate 220 (wafer) may be readily handled even in the subsequent semiconductor manufacturing process steps. Thus, the further process steps are conducted with the thinned carrier substrate 220 having the target thickness $t_B$.

Thus, step 02 of FIG. 2B may correspond to optional step 180 of FIG. 1. To summarize, step 2 of FIG. 2 (=IR emitter wafer thinning) shows the thinning of the IR emitter wafer 220 to typically less than 250 µm, but higher target thicknesses $t_B$ are of course also possible.

In case, the steps 01 and 02 of FIGS. 2A and 2B are conducted to provide the carrier substrate 220 having the target thickness $t_B$, the combination of steps 01 and 02 corresponds to step 110 of FIG. 1.

Figure 2C:
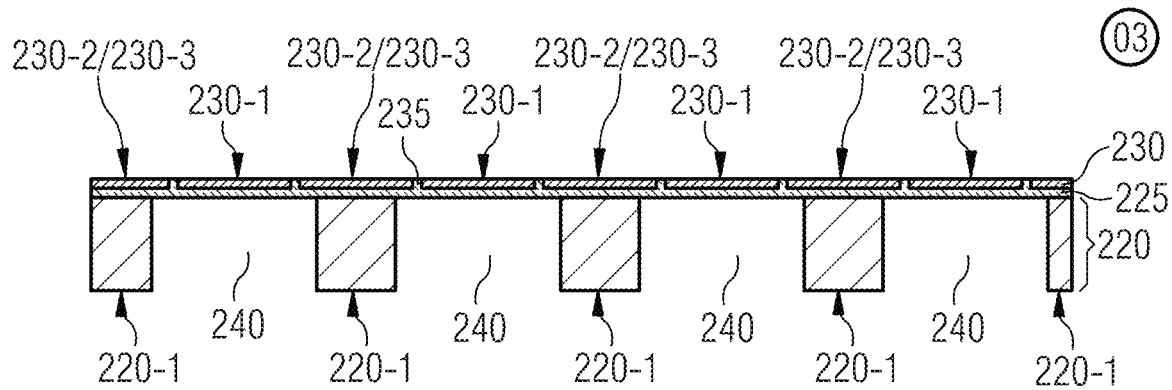

Step 03—FIG. 2C: In step 3 of FIG. 2C, a backside etching step through the carrier substrate 220 is conducted for providing cavities 240 extending between the first main surface region 220-A and the second main surface region 220-B of the carrier substrate 220. Thus, the cavities 240 form a frame structure 220-1 which laterally surrounds the cavities 240. To be more specific, the carrier substrate 220 having formed therein the cavities 240 forms the frame structure 220-1, wherein the cavities 240 are at least partially laterally surrounded by the material of the remaining carrier substrate 220.

Furthermore, first portions 230-1 of the structured conductive layer 230 which span the cavities 240 form active heating regions 230-1 of the IR emitter elements 200. Second and third portions 230-2, 230-3 of the structured conductive layer 230 which are supported by the frame structure 220-1 are arranged to form first and second contact pads 230-2, 230-3 of the IR emitter elements 200.

Thus, an etching process is then performed in step 03 from the backside 220-B of the (e.g., thinned) carrier substrate 220, within the active heating region 230-1 of the IR emitter elements 200 and up to the insulating material layer 225. The insulating material layer 225 may act as an etch stop layer. The etching step 120 may use, for example, a resist mask (not shown in FIG. 2C) for defining the regions to be removed from the carrier substrate 220. When a glass material is used for the carrier substrate 220, a wet-chemical etching step may be performed, for example, for providing the cavities 240. In the case, a semiconductor material, e.g., silicon is used for the carrier substrate 220, a Bosch etching process or a wet-etching process may be performed for producing the cavities 240.

According to an embodiment, step 03 may comprise etching a cavity 240 from the backside 220-B by using a so-called Bosch process or by a silicon wet etching process.

Thus, step 03 of FIG. 2 may correspond to step 120 of FIG. 1.

Figure 2D:
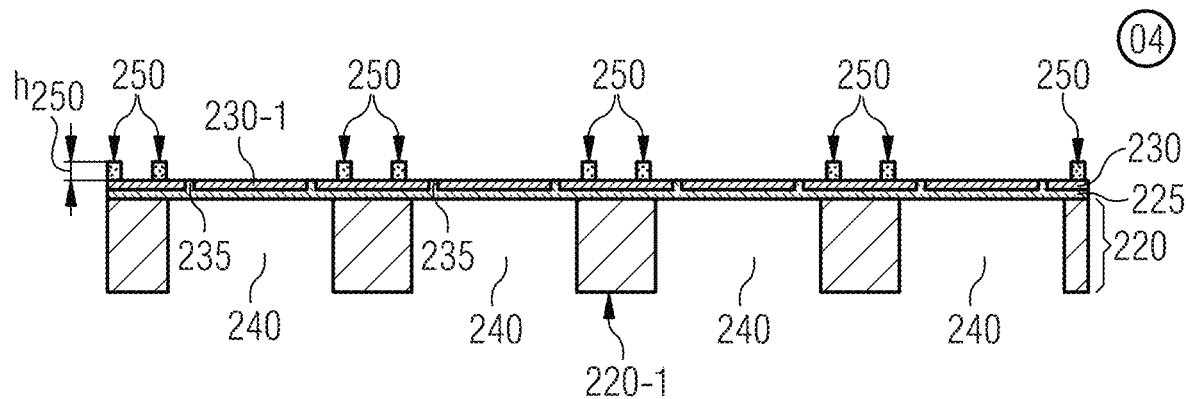

Step 04—FIG. 2D: In step 04 of FIG. 2D, adhesive spacer elements 250 (or stand-offs) are formed on portions of the structured conductive layer 230, which are supported by the frame structure 220-1 (=remaining carrier substrate 220). Thus, the adhesive spacer elements 250 are formed on portions of the structured conductive layer 230 which are placed with respect to a vertical projection of the first main surface region 220-A on the frame structure 220-1, i.e., which are supported by the frame structure 220-1. The spacer elements 250 may have a height h250 in a range between 2 and 200 µm or between 5 and 100 µm, for example.

According to an embodiment, the adhesive spacer elements 250 (=spacers or stand-offs) are applied onto the front side (=process surface) by means of applying or depositing an adhesive material layer (not shown in FIG. 2D), e.g., comprising a resist material, a polymer material (e.g., SU8, etc.) or an epoxy resin material as the adhesive material, on the exposed surface region of the structured conductive material layer 230. The adhesive material layer may be applied by means of a spin-coating process the adhesive material and may be subsequently photo-lithographically processed or structured for providing the adhesive spacer elements 250, for example.

Figure 3:
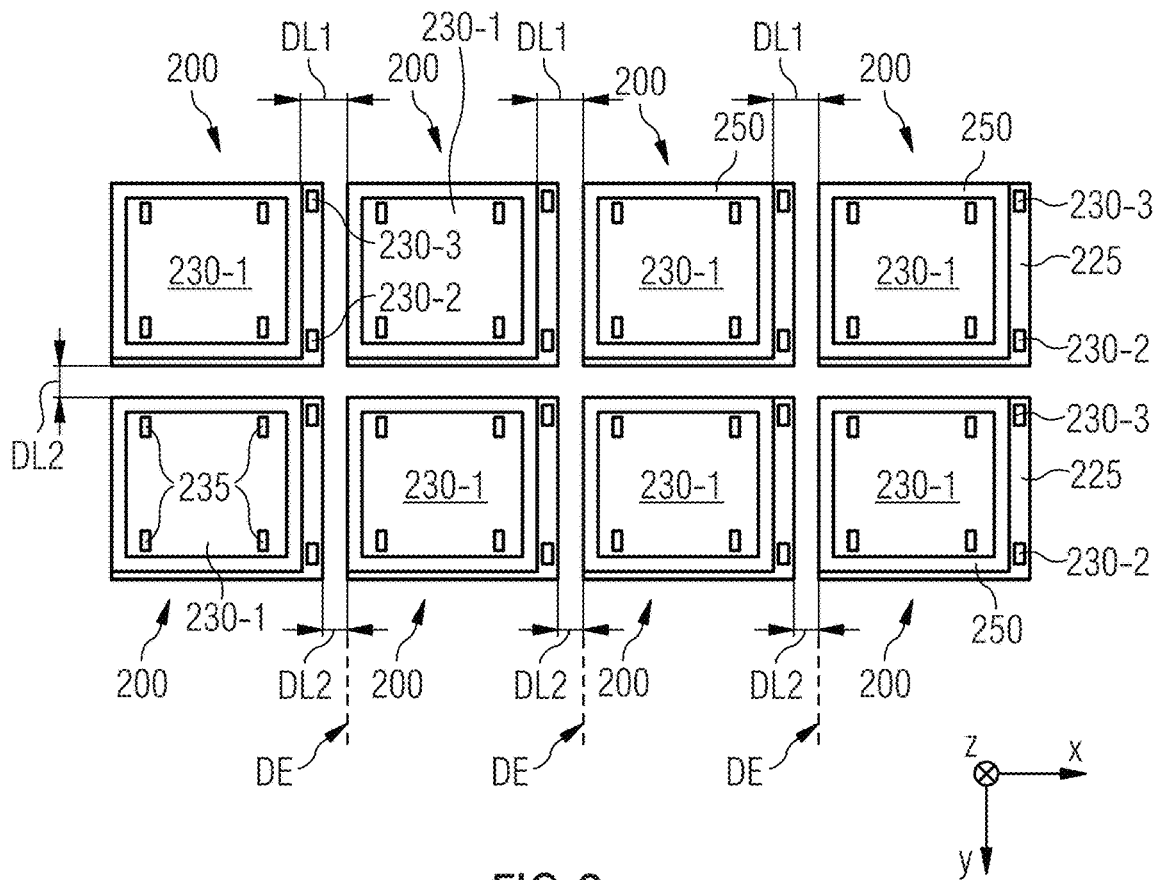
FIG. 3 shows a schematic cross sectional view in the x-y-plane of an array of manufactured integrated IR emitter elements having an optical filter on waver level according to an embodiment.

According to an embodiment, the adhesive spacer elements 250 may be formed an regions of the structured conductive layer 230 which are adjacent to and laterally surround the active heating regions 230-1 of the structured conductive layer 230 (see FIG. 3).

For the spacer elements 250, essentially any resist, epoxy resin or polymer may be used which can be applied by means of spin-coating and are capable of being photo-lithographically processed and structured thereafter.

In case, a SU8 material is used adhesive material layer, said material layer may be slightly heated (=soft baked) directly following to the spin coating process, for example, so as to "slightly" (=not completely) cure or harden the applied SU8 material for the subsequent process steps, wherein the SU8 material maintains its adhesive property. According to an embodiment, step 04 may comprise structuring a stand-off layer (not shown in FIG. 2D) to form the adhesive spacer elements 250. Step 04 may comprise, for example, applying a SU8 layer including a prebake step.

Thus, step 04 of FIG. 2D may correspond to step 130 of FIG. 1 and may optionally comprise the sub-steps 132 and 134 of FIG. 1.

Figure 2E:
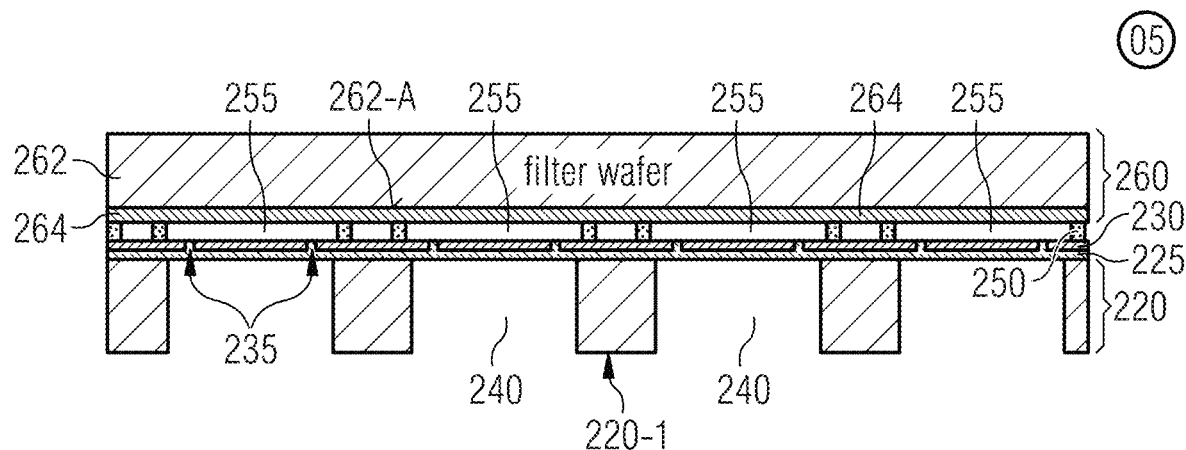

Step 05-FIG. 2E: In step 05 of FIG. 2E, a filter substrate 260 (=filter wafer) having a filter carrier substrate 262 and a filter layer 264 is placed on the adhesive spacer elements 250. The filter layer 264 is formed on a first main surface region 262-A of the filter carrier substrate 262. The filter substrate 260 is placed on the adhesive spacer elements 250 so that the filter layer 264 is arranged between the adhesive spacer elements 250 and the filter carrier substrate 262. The material of the filter carrier substrate 262 is, for example, transparent for the radiation emitted by the heater structure 230-1 (=active heating regions of the IR emitter elements 230) and transmitted through the filter layer 264.

According to an embodiment, the filter layer 164 of the filter substrate may comprise a Bragg filter structure or any other optical filter structures to provide a narrowing (=band-pass filtering) of the emission spectrum of the radiation emitted by the heater structures 230-1. The Bragg filter structure (e.g., a Fabry-Perot filter structure) may comprise opposing dielectric mirror stacks (=Bragg mirrors) with an interposed dielectric spacer layer.

According to an embodiment, the adhesive spacer elements 250 are formed to laterally surround the active heating regions 230-1 of the structured conductive layer 230. Thus, the adhesive spacer elements 250, which laterally surround the active heating regions 230-1 of the structured conductive layer 230, and the filter substrate 260 provide further cavities 255 on the active heating regions 230-1 of the structured conductive layer 230, i.e., between the filter layer 264 of the filter substrate 260 and the structured conductive layer 230 of the carrier substrate 220. This may correspond to step 140 of FIG. 1.

Thus, the structured conductive layer 230 may comprise at least one opening 235 ventilation hole to the further cavity 255 in each of the portions 230-1 of the structured conductive layer 230 which span the cavities 240.

According to an embodiment, the adhesive spacer elements 250 to the carrier substrate 220, i.e., to the structured conductive layer 230 of the carrier substrate 220, and to the filter carrier substrate 260, i.e., to the filter layer 264 of the filter carrier substrate 260, by curing (=hardening or hard baking) the material of the adhesive spacer elements 250. This may correspond to step 150 of FIG. 1.

Thus, step 05 of FIG. 2E may correspond to a combination of steps 140 and 150 of FIG. 1 for bonding the filter substrate 260 (filter wafer) to the carrier substrate 220 (IR emitter wafer).

According to step 05, a filter wafer 260 comprising the filter carrier substrate 262 and the filter layer 264, is bonded to the IR emitter wafer. The filter carrier substrate 262 is IR-transparent and may comprise a glass material or an undoped or lightly doped silicon material, for example. The optical filter layer 264 may comprise a thickness of 5 µm, or between 1 to 10 µm or between 3 to 7 µm, for example.

As the material of the adhesive spacer elements 250, e.g., the SU8 material or a different polymer, resin or resist material, is not completely cured, the adhesive spacer elements 250 are still adhesive for the filter wafer 260. During subsequent heating (=hard baking) of the material of the adhesive spacer elements 250, said material of the adhesive spacer elements 250 is essentially fully cured. The thickness of the spacers elements 250 may range between 4 to 100 µm, or between 30 and 60 µm (for SU8=40 µm±10 µm).

The spacer elements 250 provides the effect that the further cavity 255 over the active heating regions 230-1, i.e., between the filter layer 264 of the filter substrate 260 and the structured conductive layer 230 of the carrier substrate 220, provides still be enough space for the deflectable (membrane-like) active region 230-1 of the IR emitter layer 230, if, due to the thermal pulses and as a function of the pulse frequency, a deflection of the active region 230-1 of the IR emitter layer 230 occurs, so that the active region 230-1 of the IR emitter layer 230 will not abut or hit the overlying or opposing optical filter layer 264.

According to an embodiment, step 05 may comprise the bonding of the filter wafer 260 to the IR emitter wafer 220. Further, in a pre-process the IR filter wafer 260 may be provided with Bragg reflector layers to form the filter layer 264 on the filter carrier substrate 262, e.g., an IR transmittive substrate like Si. Then, the bonding of both wafers 220, 260 may including bake of SU8.

Figure 2F:
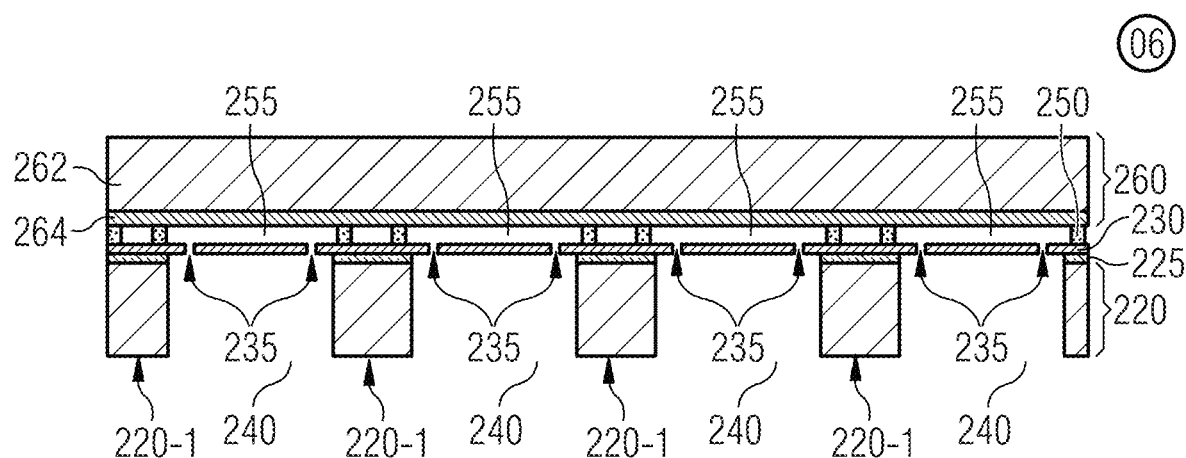

Step 06—FIG. 2F: (optional) In optional step 06 of FIG. 2F, the insulating material layer 250 may be release etched within the cavities 240 of the frame structure 220-1 for removing the insulating material layer 250 from the structured conductive layer in the region of the cavities 240. The release etching step opens the at least one opening 235 (=ventilation hole or vent hole) in the active heating area 230-1 of the structured conductive layer 230.

Thus, optional step 06 of FIG. 2F may correspond to step 190 of FIG. 1.

According to an embodiment, a release etching step may be performed so as to remove the insulating material of the insulating material layer 225 at least partially from the IR emitter layer 230 within the active region 230-1. After removing the insulating material in the ventilation holes 235 (=opening the optional ventilation holes 235), the optional ventilation holes 235 may provide for a pressure equalization during operation between the environmental atmosphere and the further cavity 255 which is formed between the integrated IR emitter elements 200 and the respective optical IR filter elements 210 during later process steps (see, for example, step 06 below).

The ventilation hole(s) 235 may be arranged at the center of the active region 230-1 of the IR emitter layer 230, e.g., with an individual central ventilation opening or with a perforation at the edge of the active region 230-1 of the IR emitter layer 230, which depends on the frequency range of the deflectable (membrane-like) active region 230-1 of the IR emitter layer 230.

Said release etching step is optional. If the insulating material of the insulating material layer 225 maintains on the conductive IR emitter layer 230, the thermal mass to be heated is increased, and, consequently, any heating processes that may take place will be slower, or will require more energy, in comparison to the case when the insulating material of the insulating material layer 225 is removed from the active heating regions 230-1 of the IR emitter elements 200.

Figure 2G:
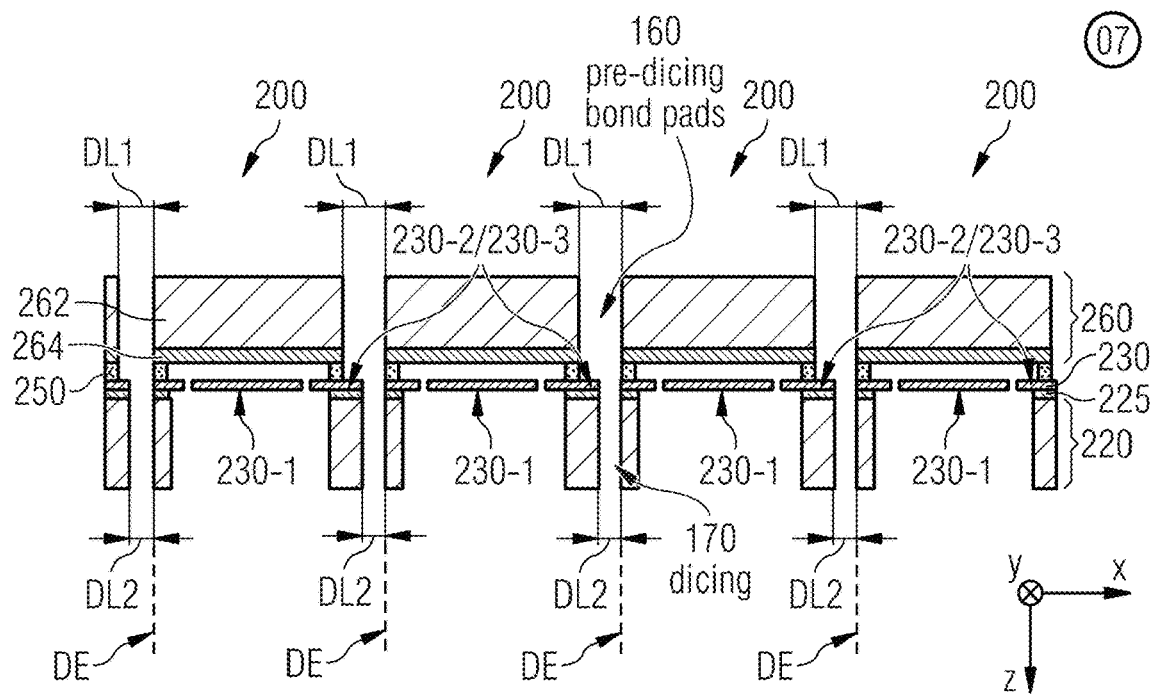

Step 07—FIG. 2G: In step 07 of FIG. 2G, a pre-dicing step (with a first dicing lane DL1), e.g., from the second main surface region 260-B of the filter substrate 260, is performed through the filter substrate 260 for exposing the contact pads 230-2, 230-2 of the structured conductive layer 230. Thus, the pre-dicing step through the filter substrate 260 comprises a dicing through the filter carrier substrate 262 and the filter layer 264. The contact pads 230-2, 230-2 are arranged with respect to a vertical projection to the first main surface region 220-A on the frame structure 220-1 of the carrier substrate 220, i.e., the contact pads 230-2, 230-2 are supported by the frame structure). This may correspond to step 160 of FIG. 1.

According to an embodiment, a dicing step (with a second dicing lane DL2) is performed through the frame structure 220-1 of the carrier substrate 220 for (mechanically) separating the integrated IR emitter elements 200 having the optical filter 210, respectively. This may correspond to step 170 of FIG. 1. Thus, the separated portions of the optical layer 264 fixed with the spacer element(s) 250 to the opposing separated portion of the carrier substrate 220 forms the optical filters 210 of the singulated integrated IR emitter elements 210.

Thus, step 07 of FIG. 2G may correspond to a combination of steps 160 and 170 of FIG. 1 for singulating (=dicing) the integrated emitter elements 200 having the optical filter 210.

Moreover, the order of the pre-dicing step and the dicing step reversed for singulating (=dicing) the integrated emitter elements 200 having the optical filter 210.

According to an embodiment, the bond pads 230-2, 230-3 are exposed during pre-dicing. The height h250 (5 to 100 µm) of the spacers 250 serves as a security clearance so as to dice merely through the filter substrate 262 and the optical filter layer 264 during the sawing process (pre-dicing) and to expose the bond pads 230-2, 230-3. The pre-dicing step may also be performed by means of a resist mask and an etching process (instead of sawing). In this manner, smaller gaps (in form of the first dicing lane DL1) may be achieved during this pre-dicing step, but a larger amount of manufacturing expenditure will be required.

Then, as a further dicing step through the substrate 220, the insulating material layer 225 and the structured conductive layer 230 is performed, e.g., by mechanical sawing or stealth dicing of the individual IR emitter elements having an optical filter.

With the further dicing step a sharp dicing edge DE (=cutting edge) through the optical filter element 210 and the IR emitters 200 may be obtained and, thus, provides a self-aligned process). Thus, in contrast to so-called pick-and-place processes, wherein the individual components are placed individually with considerable placing tolerances and connected individually, the present approach eventually involves a considerable decrease in the amount of space required for the complete IR emitters 200.

According to an embodiment, a dicing of the wafer stack 220, 260 in two steps (one step for release of bond pads, one step for complete separation is performed.

FIG. 3 shows a schematic cross sectional view in the x-y-plane of an array of manufactured integrated IR emitter elements 200 having an optical filter 100 according to an embodiment. The cross sectional view in the x-y-plane extends through the spacer elements 250.

Thus, FIG. 3 shows an array of singulated IR emitter elements 200. The schematic view of the integrated IR emitter elements 200 further shows the insulating material layer 225 on the carrier substrate 220, the portions 230-1 of the structured conductive layer 230 which span the cavities 240, the active heating regions 230-1 and the second and third portions (contact pads) 230-2, 230-3 of the structured conductive layer 230, the at least one opening 235 to the further cavity 255, and further the first and second dicing lanes DL1, DL2 together with the sharp dicing edge DE (=cutting edge).

According to an embodiment, the IR emitter chip (singulated IR emitter element) 200 is realized as a MEMS chip with a thin heater membrane 230-1, a cavity 240 in the silicon substrate 220 and optionally a vent hole 235 in the heater membrane 230-1. The filter layer 264 on the IR filter chip (filter substrate) 260 may be realized as a Bragg reflector with different poly/oxide layers on a silicon substrate 220. As integration a chip by chip stacking on chip level is conducted with a distance holder (spacer elements) 250 which may comprise a SU8 (polymer) layer, for example. The distance holder 250 between the two chips 220, 260 may avoid an excessive heating of the filter chip 260.

In the following, some implementations of the present method for manufacturing the integrated IR emitter elements 200 having an optical filter 210 and the technical effects resulting therefrom are summarized.

The described manufacturing method 100 allows for to inexpensively and at low cost manufacture integrated IR emitters 200 having an optical filter 210, e.g., for gas sensing applications, such as PAS gas sensors, wherein the resulting IR emitter 100 may be obtained with a small form factor such that it is optimized in terms of surface area (=footprint) and used space. Moreover, the integrated IR emitters 200 having an optical filter 210 can be used in other applications, too.

To reduce the size and height of the integrated IR emitters 200 having the optical filter 210 and also to reduce the costs, the present solution is based on wafer level processes and wafer-to-wafer bond processes. To further reduce the costs the process is setup without any alignment during wafer bonding. By bonding of the IR emitter wafer 220 with a IR filter wafer 260 without alignment of the wafers 220, 260 to each other a system solution with lowest form factor and costs can be achieved.

The (optional) thinning of IR emitter device wafer 220 and the unstructured IR filter wafer 260 define the desired final thicknesses. The bonding of both wafers, i.e., the IR emitter device wafer 220 and the unstructured IR filter wafer 260, on wafer level may be performed with a prebaked polymer material, an epoxy resin material or a photoresist material, e.g. SU8, on the IR emitter device wafer 220. Finally, a 2-step dicing of complete system stack of emitter and filter wafer 220, 260 (including pre-dicing over bond pads) can be conducted.

Additional embodiments and aspects are described which may be used alone or in combination with the features and functionalities described herein.

Although some aspects have been described as features in the context of an apparatus it is clear that such a description may also be regarded as a description of corresponding features of a method. Although some aspects have been described as features in the con-text of a method, it is clear that such a description may also be regarded as a description of corresponding features concerning the functionality of an apparatus.

In the foregoing Detailed Description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, subject matter may lie in less than all features of a single disclosed example. Thus the following claims are hereby incorporated into the detailed Description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

Although specific embodiments have been illustrated and described herein, it will be appreciated by those of ordinary skill in the art that a variety of alternate and/or equivalent implementations may be substituted for the specific embodiments shown and described without departing from the scope of the present embodiments. This application is intended to cover any adaptations or variations of the specific embodiments discussed herein. Therefore, it is intended that the embodiments be limited only by the claims and the equivalents thereof.

What is claimed is:

1. A method for manufacturing integrated IR (IR=infrared) emitter elements having an optical filter, comprising:
    providing a carrier substrate having a target thickness, wherein an insulating material layer and a structured conductive layer are arranged on a first main surface region of the carrier substrate, wherein the insulating material layer is arranged between the carrier substrate and the structured conductive layer;
    back side etching through the carrier substrate for providing cavities extending between the first and second main surface regions of the carrier substrate, wherein the cavities form a frame structure which laterally surrounds the cavities,
    wherein first portions of the structured conductive layer which span the cavities form active heating regions of the IR emitter elements, and
    wherein second and third portions of the structured conductive layer which are supported by the frame structure form first and second contact pads of the IR emitter elements;
    forming adhesive spacer elements on portions of the structured conductive layer, which are supported by the frame structure;
    placing a filter substrate having a filter carrier substrate and a filter layer on the adhesive spacer elements, so that the filter layer is arranged between the adhesive spacer elements and the filter carrier substrate;
    fixing the adhesive spacer elements to the carrier substrate and the filter carrier substrate by curing the material of the adhesive spacer elements;
    pre-dicing through the filter substrate for exposing the contact pads of the structured conductive layer; and
    dicing through the frame structure of the carrier substrate for separating the integrated IR emitter elements having the optical filter.

2. The method according to claim 1, wherein the step of forming adhesive spacer elements comprises the following sub-steps:
    depositing an adhesive material layer on the exposed surface region of the structured conductive material layer, and
    photo-lithographically structuring the deposited adhesive layer for providing the adhesive spacer elements.

3. The method according to claim 2, wherein the adhesive material comprises at least one of a polymer material, an epoxy resin material and a photoresist material.

4. The method according to claim 2, wherein the step of depositing comprises spin-coating the adhesive material on the exposed surface region of the structured conductive material layer.

5. The method according to claim 1, further comprising:
release etching the insulating material layer for removing the insulating material layer within the frame structure from the structured conductive layer.

6. The method according to claim 5, wherein the release etching step opens the at least one opening in the active heating area of the structured conductive layer.

7. The method according to claim 1, further comprising:
thinning the carrier substrate from the second main surface region for providing the carrier substrate having the target thickness.

8. The method according to claim 1, wherein the carrier substrate comprises a semiconductor material or a glass material,
wherein the back side etching step comprises a Bosch-etching process in case the carrier substrate comprises a semiconductor material, or
wherein the back side etching step comprises a wet etching step in case the carrier substrate comprises a glass material.

9. The method according to claim 1, wherein the adhesive spacer elements are formed to laterally surround the active heating regions of the structured conductive layer.

10. The method according to claim 1, wherein the adhesive spacer elements, which laterally surround the active heating regions of the structured conductive layer, and the filter substrate provide further cavities on the active heating regions of the structured conductive layer.

11. The method according to claim 1, wherein the structured conductive layer comprises at least one opening in each of the portions of the structured conductive layer which span the cavities.

12. The method according to claim 1, wherein the pre-dicing step through the filter substrate comprises a dicing through the filter carrier substrate and the filter layer.

13. The method according to claim 1, wherein the material of the filter carrier substrate is transparent for the radiation emitted by the active heating regions of the IR emitter elements and transmitted through the filter layer.

14. The method according to claim 1, wherein the filter layer of the filter substrate comprises a Bragg filter structure.

* * * * *